(12) United States Patent
Blackwood et al.

(10) Patent No.: US 8,097,308 B2
(45) Date of Patent: Jan. 17, 2012

(54) PROTECTIVE LAYER FOR CHARGED PARTICLE BEAM PROCESSING

(75) Inventors: Jeff Blackwood, Portland, OR (US); Stacey Stone, Portland, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 11/929,709

(22) Filed: Oct. 30, 2007

(65) Prior Publication Data

US 2008/0102224 A1 May 1, 2008

Related U.S. Application Data

(60) Provisional application No. 60/855,536, filed on Oct. 31, 2006.

(51) Int. Cl.
*C23C 14/28* (2006.01)

(52) U.S. Cl. ............ 427/595; 427/8; 427/504; 427/552

(58) Field of Classification Search .................. 427/595, 427/8, 504, 552
See application file for complete search history.

(56) References Cited

U.S. PATENT DOCUMENTS

| | | | |
|---|---|---|---|
| 4,981,625 A * | 1/1991 | Rhim et al. ................ | 264/13 |
| 5,270,552 A | 12/1993 | Ohnishi et al. | |
| 5,574,280 A | 11/1996 | Fujii et al. | |
| 6,303,932 B1 | 10/2001 | Hamamura et al. | |
| 6,664,552 B2 | 12/2003 | Shichi et al. | |
| 6,753,538 B2 | 6/2004 | Mucil et al. | |
| 6,794,663 B2 | 9/2004 | Shichi et al. | |
| 6,926,935 B2 | 8/2005 | Arjavac et al. | |
| 7,268,356 B2 | 9/2007 | Shichi et al. | |
| 7,601,246 B2 | 10/2009 | Kim et al. | |
| 2003/0047691 A1* | 3/2003 | Musil et al. ................ | 250/492.2 |
| 2006/0130734 A1* | 6/2006 | Koivukunnas et al. ....... | 116/216 |
| 2006/0261270 A1* | 11/2006 | Burkhardt et al. ............ | 250/311 |
| 2007/0003847 A1* | 1/2007 | Chopra et al. .................. | 430/14 |
| 2008/0073587 A1 | 3/2008 | Schmidt et al. | |
| 2008/0191151 A1 | 8/2008 | Shichi et al. | |

FOREIGN PATENT DOCUMENTS

WO PCT/US2005/005643 A 9/2005

* cited by examiner

*Primary Examiner* — Michael Cleveland
*Assistant Examiner* — Xiao Zhao
(74) *Attorney, Agent, or Firm* — Scheinberg & Griner, LLP; Michael O. Scheinberg; David Griner

(57) ABSTRACT

A protective layer is applied to a work piece to protect the surface during charged particle beam processing by directing a fluid toward the surface. The surface is preferably not touched by the applicator. Ink jet print-type print heads are suitable applicators. Ink jet-type print heads allow a wide variety of fluids to be used to form the protective layer. Useful fluids that form protective layers include colloidal silica having small silver particles and hydrocarbon-based inks.

24 Claims, 4 Drawing Sheets

PROTECTIVE LAYER FOR CHARGED PARTICLE BEAM PROCESSING

This application claims priority from U.S. Prov. App. No. 60/855,536, filed Oct. 31, 2006, which is hereby incorporated by reference.

TECHNICAL FIELD OF THE INVENTION

The present invention relates to the application of a protective layer onto a work piece surface to protect the surface during charged-particle-beam processing.

BACKGROUND OF THE INVENTION

Charged particles beams, such as ion beams and electron beams, are used for processing work pieces in nanotechnology because charged particle beams can form very small spots. For example, focused ion beam systems are able to image, mill, deposit, and analyze with sub-micron precision. Focused ion beam systems are commercially available, for example, from FEI Company, Hillsboro, Oreg., the assignee of the present application. The ions can be used to sputter, that is, physically eject, material from a work piece to produce features, such as trenches, in the work piece. An ion beam can also be used to activate an etchant gas to enhance sputtering, or to decompose a precursor gas to deposit material near the beam impact point. An ion beam can also be used to form an image of the work piece, by collecting secondary particles ejected by the impact of the ion beam. The number of secondary particles ejected from each point on the surface is used to determine the brightness of the image at a corresponding point on the image. Focused ion beams are often used in the semiconductor industry. In one application, for example, a focused ion beams is used to cut a small trench into an integrated circuit to expose a cross section of a vertical structure for observation or measurement using an ion beam or an electron beam.

Electron beams can also be used to process a work piece. Electron beam processing is described, for example in U.S. Pat. No. 6,753,538 to Mucil et al. for "Electron Beam Processing." Electron beams are more commonly used for forming images in a process called electron microscopy. Electron microscopy provides significantly higher resolution and greater depth of focus than optical microscopy. In a scanning electron microscope (SEM), a primary electron beam is focused to a fine spot that scans the surface to be observed. Secondary electrons are emitted from the surface as it is impacted by the primary beam. The secondary electrons are detected, and an image is formed, with the brightness at each point of the image being determined by the number of secondary electrons detected when the beam impacts a corresponding point on the surface.

In a transmission electron microscope (TEM), a broad electron beam impacts the sample and electrons that are transmitted through the sample are focused to form an image of the sample. The sample must be sufficiently thin to allow many of the electrons in the primary beam to travel though the sample and exit on the opposite site. Samples are typically thinned to a thickness of less than 100 nm. One method of preparing samples includes using a focused ion beam to cut a thin sample from a work piece, and then using the ion beam to thin the sample.

In a scanning transmission electron microscope (STEM), a primary electron beam is focused to a fine spot, and the spot is scanned across the sample surface. Electrons that are transmitted through the work piece are collected by an electron detector on the far side of the sample, and the intensity of each point on the image corresponds to the number of electrons collected as the primary beam impacts a corresponding point on the surface.

When a charged particle beam impacts a surface, there is the potential for damage or alteration of the surface. Focused ion beam systems typically use gallium ions from liquid metal gallium ion source. Gallium ions are relatively heavy, and a gallium ion accelerated through a typical 30,000 volts will inevitably alter the work piece surface. Plasma ion systems, such as the one described in WO20050081940 of Keller et al. for a "Magnetically Enhanced, Inductively Coupled, Plasma Source for a Focused Ion Beam System" can use lighter ions, which cause less damage, but the ions will still typically alter the work piece surface. Electrons, while much lighter than ions, can also alter a work surface. When a user desires to measure a work piece with an accuracy of nanometers, changes in the work piece caused by the impact of charged particles can be significant, especially in softer materials, such as photoresist and low and ultra-low-k dielectric materials, such as polyphenylene materials.

To protect the work piece surface, it is common to apply a protective layer before charged-particle-beam processing. One method of applying a protective layer is charged-particle-beam deposition, that is, using a charged-particle beam to provide energy to decompose a gas to deposit a material on the surface. The protective layer shields the area around the cut and preserves the characteristics of the features that are to be imaged and measured. Commonly used deposition gasses include precursor compounds that decompose to deposit tungsten, platinum, gold, and carbon. For example, tungsten hexacarbonyl can be used to deposit tungsten, methylcyclopentadienyl trimethyl platinum can be used to deposit platinum, and styrene can be used to deposit carbon. Precursor gases to deposit many different materials are known in the art. The preferred material to be deposited as a protective layer depends on the application, including the composition of the underlying target surface, and the interaction between the protective layer material and the target surface.

Although charged-particle-beam-assisted deposition can locally apply a layer at the precise location where the layer is needed, applying a protective layer using charged particle beam deposition has several disadvantages. Charged-particle-beam-assisted deposition is relatively slow and, in some processes, up to sixty percent of the total processing time is consumed in deposition of the protective layer. When an ion beam is initially scanned onto the target surface to deposit material, the beam sputters material away from the surface for an initial period of time until a sufficient amount of deposition material accumulates to shield the surface from the ion beam. Even though that period of time may be small, it can be large enough to allow a significant amount of material to be removed, which causes the accuracy of the cross-sectional analysis to be compromised.

Currently, technicians quantify the dimensional change that is caused by the charged particle beam deposition of the protective layer, and then apply a correction factor to subsequent measurements to obtain an estimate of the true dimension. Such estimates are not always accurate because of the variation in the alteration by the charged particle beam. When a user desires to use an ion beam to extract a sample viewing with a TEM, as described for example, in U.S. Pat. No. 5,270,552 to Ohnishi, et al. "Method for Separating Specimen and Method for Analyzing the Specimen Separated by the Specimen Separating Method," the user typically scans the focused ion beam in an imaging mode to locate the region of interest. The scanning causes damage to the surface. When the region of interest is located and the beam begins to mill a trench, there is additional damage to the work piece because the edges of the beam are not perfectly sharp. That is, the beam is typically Gaussian shaped, and the ions in the tail of the Gaussian distribution will damage the work piece at the edge of the trench. Damage has been found not just on fragile materials, but also on relatively hard materials.

Electron and laser beams can be used to generate secondary electrons to decompose a precursor gas to deposit a protective layer, but those beams may also damage the underlying surface—especially when they are at sufficient energy and/or current density levels for achieving favorable processing time. It is normally not practical to use such beams because deposition will typically be too slow if the beams are "weak" enough not to harm the underlying surface. Physical vapor deposition ("PVD") sputter methods could be used to deposit protective layers in some applications, but they normally cannot be utilized for production control applications in wafer fabrication facilities because such methods cannot be used to locally apply a deposition layer onto a targeted part of the wafer surface. U.S. patent application Ser. No. 11/706, 053 now U.S. Pat. No. 7,675,049, of Schmidt et al. for "Sputtering Coating of Protective Layer for Charged Particle Beam Processing" which is assigned to the assignees of the present invention, describes a method of PVD that can provide a localized layer. A charged-particle beam is used to sputter material from a target onto the surface. The charged-particle beam is not directed to the surface itself and damage is avoided. This method, however, is time consuming.

Another method of applying a protective coating is described is U.S. Pat. No. 6,926,935 to Arjavec et al. for "Proximity Deposition." In this method, the charged particle beam is not directed at the area of interest, but to a region outside the area of interest. Secondary electrons decompose the precursor gas over the area of interest to provide a protective layer. As the protective layer is being created around the edge of the region of interest, the charged particle beam can be moved inward. This method is also time consuming.

Colloidal silver applied with a brush has long been used to produce a conductive protective layer in scanning electron microscopy. The silver particles used are relatively large. Using a brush to apply the layer can damage the substrate and cannot provide a localized layer.

Another method of applying a protective coating is to use a felt tip pen, such as a Sharpie brand pen from the Sanford division of Rubbermaid corporation The ink from a Sharpie pen is suitable for use in a vacuum chamber, because it dries thoroughly, and there is little outgassing in the vacuum chamber. Touching the pen to the region of interest would alter the surface, so the ink is applied near the region of interest, and the ink then wicks onto the region of interest. Compounds in the ink protect some surfaces. The area affected by the felt tip is very large compared to the sub-micron features of modern integrated circuits, and the positioning accuracy of the ink is insufficient.

The industry needs a method of rapidly and accurately applying a localized protective layer without damaging a work piece surface.

SUMMARY OF THE INVENTION

An object of the invention is to provide a local protective layer for charged particle beam processing.

In accordance with the method, liquid is directed to a region of interest on the work piece surface. The liquid dries on the surface to provide a protective layer. In a preferred embodiment, the surface is not touched by the applicator. For example, a drop of liquid can be ejected from a source and directed towards the work piece.

BRIEF DESCRIPTION OF THE DRAWINGS

For a more through understanding of the present invention, and advantages thereof, reference is now made to the following descriptions taken in conjunction with the accompanying drawings, in which.

DETAILED DESCRIPTION OF PREFERRED EMBODIMENTS

Figure 1:
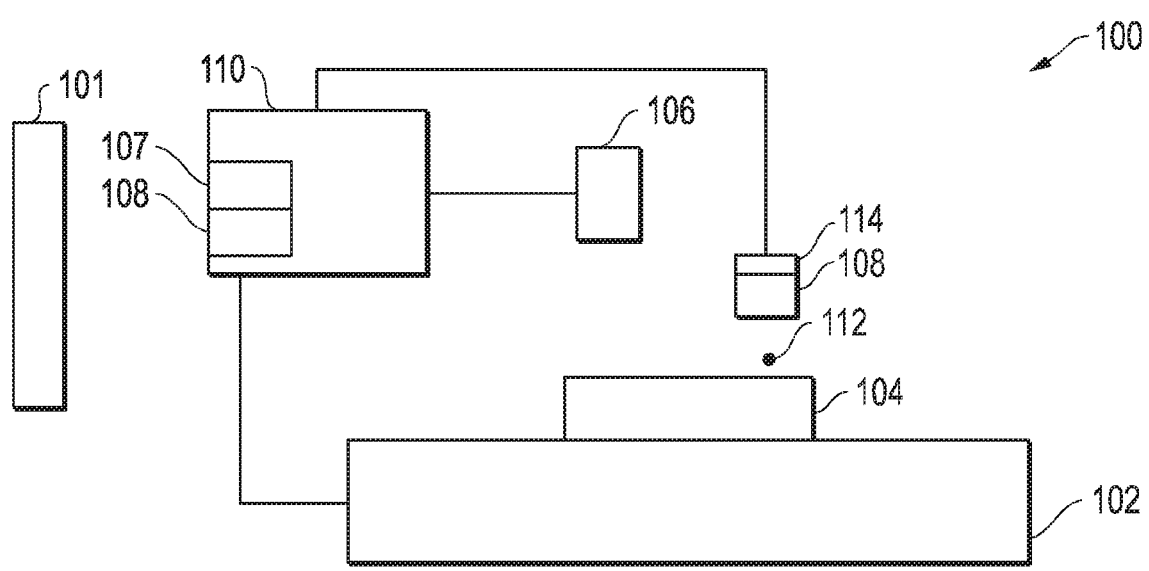
FIG. 1 is a block diagram showing a preferred embodiment of the present invention.

A preferred embodiment of the invention uses an ink jet-type dispenser to locally apply a drop of fluid to a work piece. The fluid dries to form a protective layer. For example, the fluid can be a hydrocarbon based ink or it could be a colloidal solution containing, for example, silver.

Embodiments provide for the high throughput application of a localized protective layer. Embodiments also provide damage-free deposition of a protective layer. The invention provides flexibility in choice of protective layer - the layer material can be changed by changing the fluid source. A system in accordance with the invention allows for deposition of the protective layer outside of the vacuum chamber, so that the protective layer can be applied to one work piece while a second work piece is being processed by the charged particle beam system.

In some embodiments, an ink jet head similar or identical to those used in ink jet printers can apply the fluid. The type of fluid being applied can be readily changed by changing ink cartridge. The fluid source could be an ink cartridge, and can be integrated with existing front end system of the charged particle beam as shown, for example, in FIG. 3.

The fluid typically comprises a liquid carrier having a solute or suspension contained therein. After the fluid is applied, the drop dries, for example, by evaporation of the liquid carrier or by a chemical alteration, such as hydration. A preferred protective layer is sufficiently conductive to dissipate any electrical charge produce by the impact of the charged particle beam onto the work piece. A preferred protective layer is "vacuum friendly," that is, it does not "outgas" or continue to evaporate in the charged-particle beam vacuum chamber to interfere with the charged particle beam or contaminate the work piece. A preferred protective layer stabilizes the structures on the work piece. The preferred protective layer does not interact with or alter the structures on the work piece and provides mechanical strength so that the dimensions of structures changes little or not at all under the impact of the charged particle beam.

A preferred embodiment deposits a small drop of a fluid onto the work piece, and the drop that dries to form a protective layer. The drop can be applied outside of the vacuum chamber, and the fluid can dry before being place in the vacuum chamber. In some embodiments, a low volatility fluid that dries by chemical change, rather than by evaporation, can be applied within a vacuum chamber.

Technologies to provide an accurately placed, small drop are known, for example, from ink jet printer technology.

There are several well developed ink jet technologies. Thermal ink jet printers use electrically heated ink chambers to rapidly form a bubble that propels ink from a chamber. The fluids used in a thermal printer must have properties suitable for rapidly forming a bubble, without leaving behind contamination. A continuous ink jet uses a high pressure pump to expel the ink, which is typically broken into drops by a piezoelectric crystal. An electrode applies a controlled electric charge to the drops, which are deflected by a second electrode. Lastly, in piezoelectric printers, an electrical current causes a piezoelectric crystal to rapidly deform to propel a drop of ink from a chamber. Piezoelectric printer can accommodate a wider variety of fluids than can a thermal ink jet printer.

An ink jet printer is capable of creating drops having volumes on the order of picoliters. The spot size for the local protective layer applied by the drop preferably has an area of less than about 100 $\mu m^2$, more preferably less than about 50 $\mu m^2$, and most preferably less than about 10 $\mu m^2$. Modern ink jet printers are capable of producing a spot size having a diameter of less than 4 $\mu m^2$.

The smaller the spot size, the greater the placement accuracy is required to ensure that the region of interest is covered by the protective layer. Ideally, a system uses the smallest drop size that reasonably ensures coverage of the region of interest at the available placement accuracy. Modern ink jet printers are also accurate to with 3 $\mu m$ in drop placement. To place the drop, an optical microscope image can be used, together with image recognition software, to align the ink jet coordinate system with the work piece coordinate system. Image recognition systems are available, for example, from Cognex Corporation.

Inexpensive inkjet technologies provide individual spot placement that can be controlled tightly to within 20 $\mu m$ with a drop volume of 4 pL (4 $\mu m^3$). Thermal dye deposition yields similar placement with slightly larger drop volumes, while offering significantly greater flexibility in deposition material composition. Thermal dye deposition, also called dye-sublimation, is a process of thermally evaporating a small amount of the dye/protective layer, and then the evaporated material deposits onto the target, not going through a liquid phase. Current practices require FIB related damage (deposition and Ga+ contamination) levels to be limited to within a 150 $\mu m$ radius of the process site. The positioning accuracy and droplet volumes mentioned above should satisfy this requirement.

If a colloidal suspension is used to deposit the protect layer, the particles sizes, for example, of silver, are preferably less than about 100 nm, more preferably less than about 50 nm, and most preferably between about 1 nm and about 10 nm. Silver is a preferred material because it does not react with a semiconductor work piece surface and is conductive.

Another useful fluid for applying a protective layer comprises hydrocarbon-based inks.

Preferred protective layer application solutions not only provide a protective layer having the desirable properties described above, a preferred solution should be capable of being used in the application system described above. As described above, different ink ejection systems may be require certain properties in the fluids used.

Figure 2:
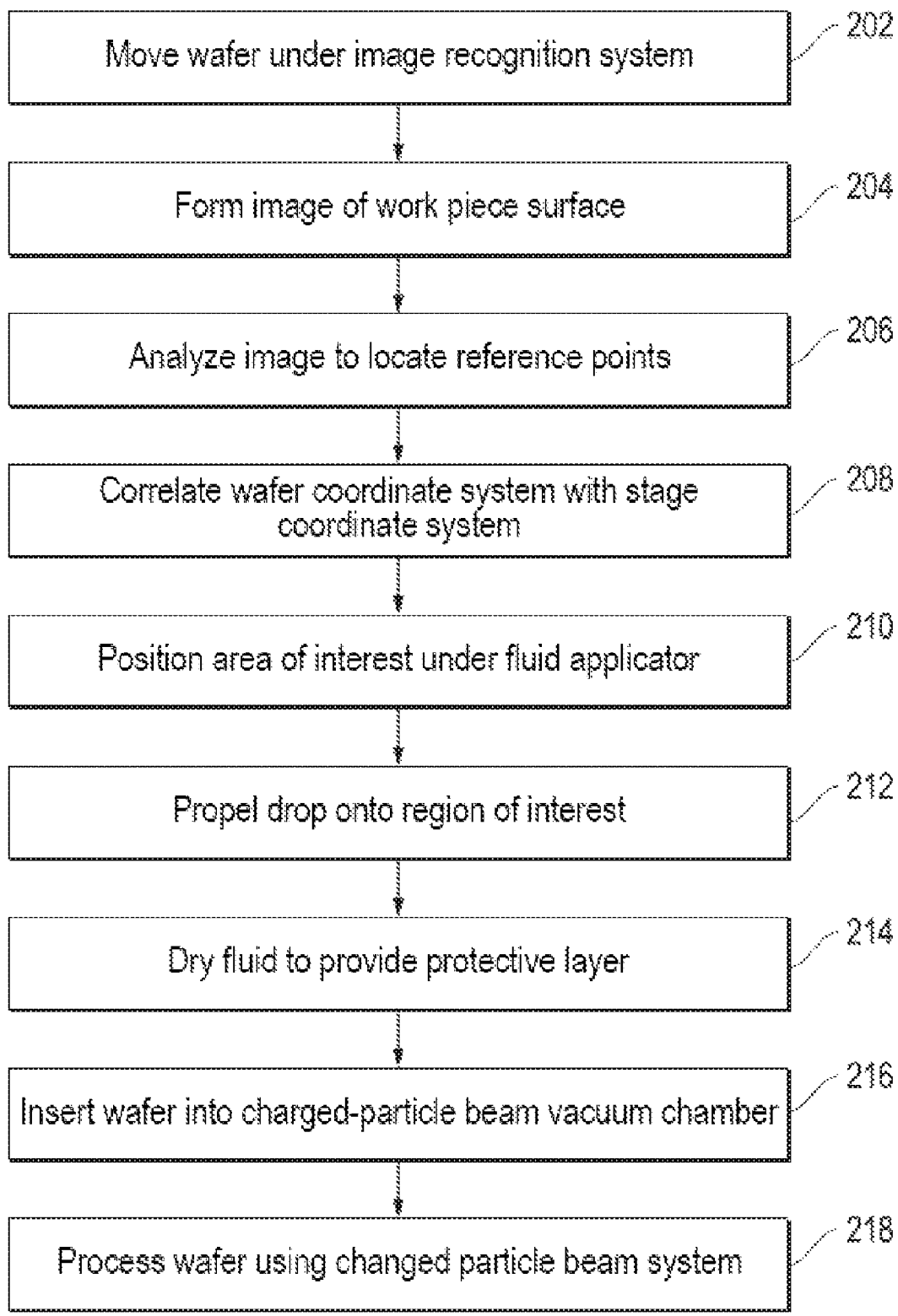
FIG. 2 is a flow chart showing preferred steps of using the system of FIG. 1.

FIG. 1 is a block diagram showing a preferred protective layer application system 100 for use with a charged particle beam system 101. FIG. 2 is a flow chart showing the steps of a preferred method of the present invention. In step 202, a precision stage 102 capable of precisely positioning a work piece, such as a semiconductor wafer 104, moves the wafer 104 under a camera 106 that is part of an optical recognition system including a computer 110. In step 204, the optical recognition system 106 forms one or more images of the work piece surface and in step 206, the image is analyzed by image recognition software 107 to recognize reference points on the wafer. In step 208, design information from the wafer is used to correlate the coordinate system of the wafer as determined from the image with the coordinate system of the stage 102. In step 210, the stage is moved so that the area of interest of the wafer 104 is under an ink jet type print head 108. In step 212, a drop of fluid 112 is propelled from the ink jet type head to the wafer. The fluid is supplied by a reservoir 114 or by a carrier, such as the carrier film used with dye sublimation system (not shown). If necessary, the fluid is allowed to dry in step 214. Skilled persons will recognize that in a dye sublimation system, the fluid that is the source of the protective layer is a gas that condenses as a solid onto the work piece, and thus does not need to dry. The wafer is inserted into a charged-particle beam vacuum chamber in step 216. In step 218, a portion of the region of interest is processed by charged particle beam processing. In some embodiments, rather than moving the wafer on a stage to position the region of interest under the ink jet, the ink jet is moved to a position above the region of interest. In other embodiments, the ink jet is aligned by a combination of moving the ink jet and moving the wafer.

Figure 3:
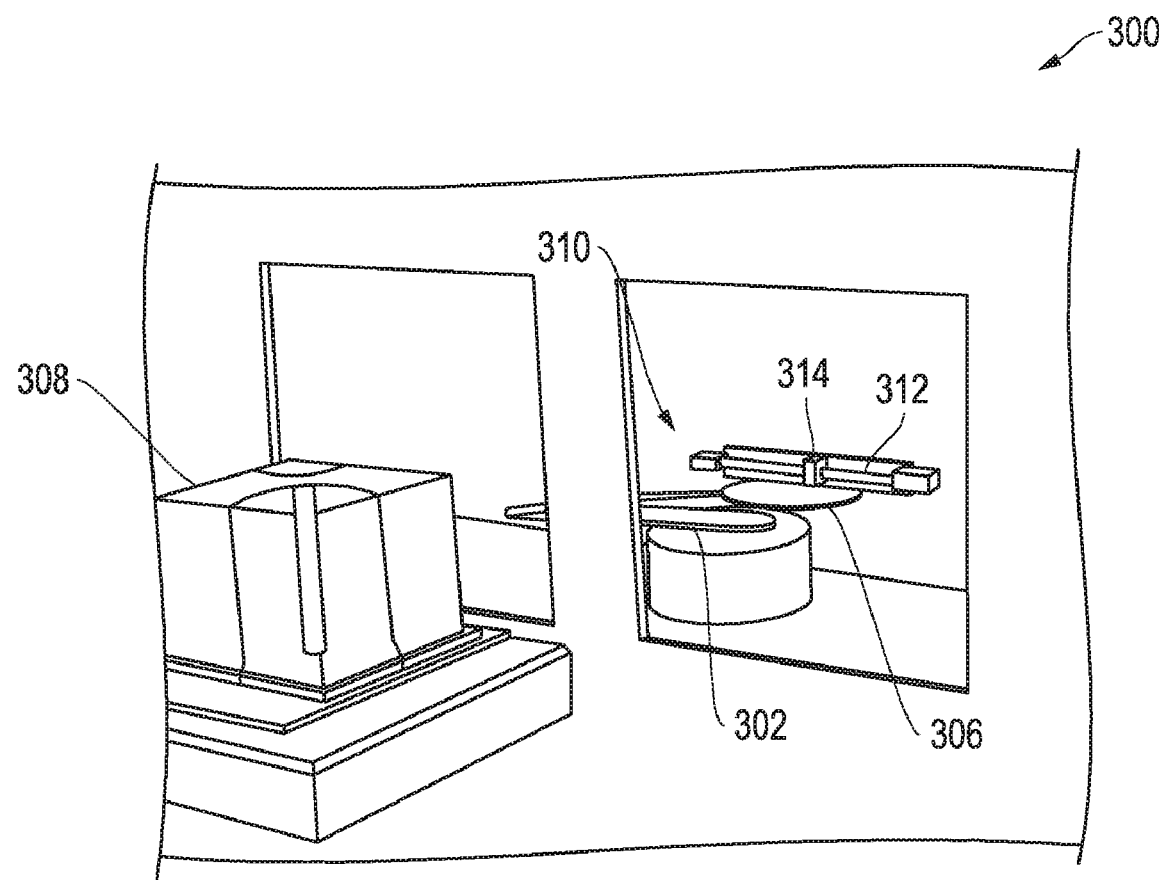
FIG. 3 shows an embodiment of the invention in which an ink jet system is positioned outside the vacuum chamber of a charged particle beam system.
Figure 4:
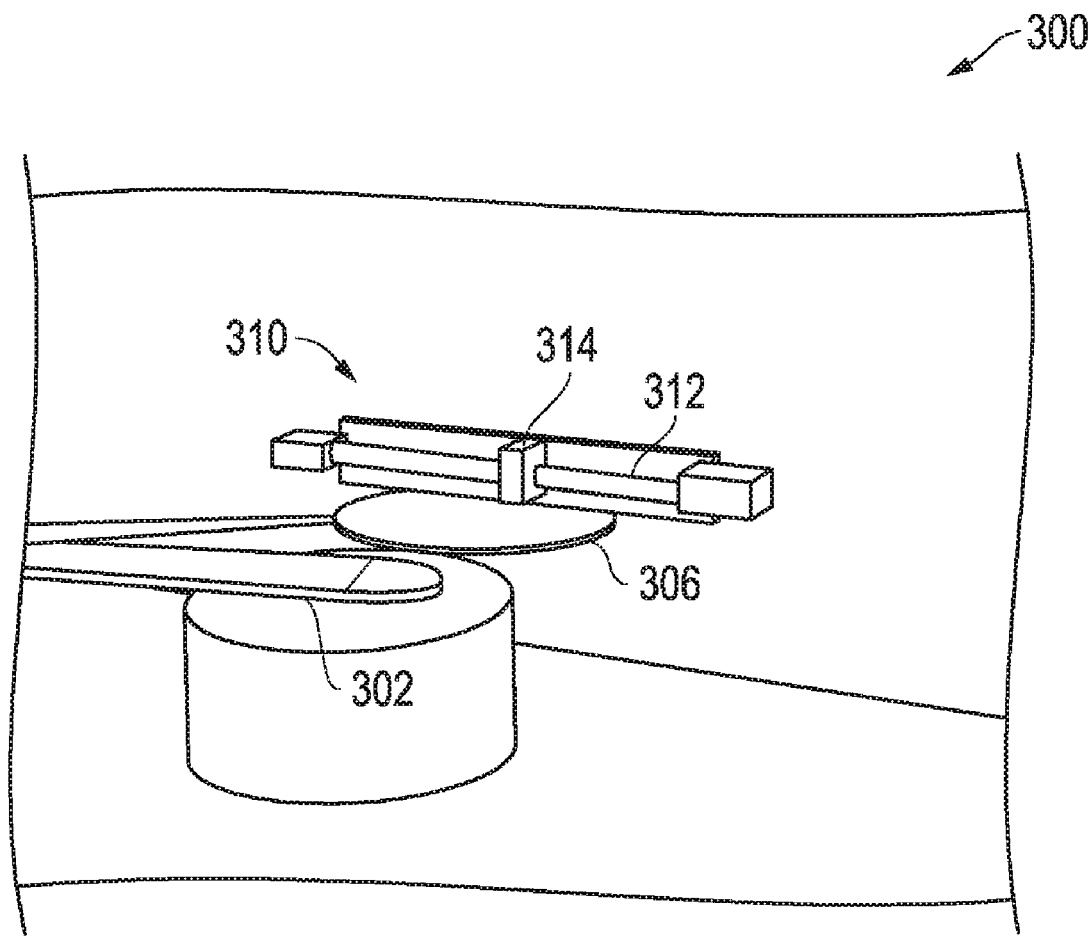
FIG. 4 is an enlarged view of the system of FIG. 3.

FIG. 3 shows a work station 300 at which a simulation of a robot wafer handler 302 removes a wafer 306 from a cassette 308 and places the wafer under an ink jet head assembly 310, which includes a support 312 upon which an ink jet head 314 can move or is fixed. FIG. 4 shows an enlarged picture of the work station of FIG. 3.

Although the present invention and its advantages have been described in detail, it should be understood that various changes, substitutions and alterations can be made herein without departing from the spirit and scope of the invention as defined by the appended claims. For example, although liquids and gases are described above, a fine powder may be applied as the protective layer. A fluid as herein means anything that flows, including a liquid, gas, or a fine powder. A fluid does not include a charged particle beam, such as a beam from an ion or a cluster source. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of providing a protective layer over a target area on a work piece for charged particle beam processing, comprising:

directing only a single drop of fluid toward the target area, said target area being the entire area to be covered with the protective layer, the single drop being of a size large enough to cover the entire target area, the applicator of the fluid not touching the target area and the fluid solidifying to form a protective layer; and directing a charged particle beam toward a portion of the protective layer.

2. The method of claim 1 in which the single drop of fluid includes a colloidal suspension.

3. The method of claim 2 in which the colloidal suspension is a colloid of silver.

4. The method of claim 2 in which the average particle size in the colloid is less than 100 nm.

5. The method of claim 2 in which the average particle size in the colloid is less than 50 nm.

6. The method of claim 1 in which the single drop of fluid is a hydrocarbon based ink.

7. The method of claim 1 in which the single drop of fluid has a volume of less than 20 pL.

8. The method of claim 1 in which the single drop is applied by an ink jet type print head.

9. The method of claim 8, in which the ink jet type print head includes a thermal, continuous and/or piezoelectric ink jet type print head.

10. The method of claim 1, in which the drop of fluid has a volume of at least 4 pL.

11. The method of claim 10, wherein directing the single drop includes directing the single drop with a positioning accuracy of within 20 μm.

12. The method of claim 1, in which the target area is of a size from 4 μm$^2$ to less than 100 μm$^2$.

13. The method of claim 1, wherein directing the single drop includes directing the single drop with a positioning accuracy of within 3 μm.

14. A method of providing a protective layer onto a target area of a work piece for charged particle beam processing, comprising:
    accurately directing a single drop of fluid toward the target area, the target area having a size from 4 μm$^2$ to less than 100 μm$^2$ and the single drop being of a size large enough to cover the entire target area, the applicator of the fluid not touching the target area and the fluid solidifying to form a protective layer; and
    directing a charged particle beam toward a portion of the protective layer.

15. The method of claim 14 in which accurately directing a single drop of fluid toward the target area includes applying a voltage to a piezoelectric crystal to propel the single drop of fluid toward the target area.

16. The method of claim 14 in which accurately directing a single drop of fluid toward the target area includes applying a voltage to heat the fluid to propel the single drop of fluid toward the target area.

17. The method of claim 14 in which accurately directing a single drop of fluid toward the target area includes thermally evaporating a small amount of material, the material then depositing onto the work piece to form a protective layer.

18. The method of claim 14 in which the liquid includes a low volatility fluid that dries by chemical change and not by evaporation.

19. The method of claim 14 in which the liquid is applied within a vacuum chamber.

20. The method of claim 14, in which the single drop is applied by an ink jet type print head.

21. The method of claim 20, in which the ink jet type print head includes a thermal, continuous and/or piezoelectric ink jet type print head.

22. The method of claim 14, in which the drop of fluid has a volume of at least 4 pL.

23. The method of claim 22, wherein directing the single drop includes directing the single drop with a positioning accuracy of within 20 μm.

24. The method of claim 14, wherein accurately directing the single drop includes directing the single drop with a positioning accuracy of within 3 μm.

* * * * *